(12) United States Patent
Wilson et al.

(10) Patent No.: US 8,213,229 B2
(45) Date of Patent: Jul. 3, 2012

(54) ERROR CONTROL IN A FLASH MEMORY DEVICE

(75) Inventors: Bruce A. Wilson, San Jose, CA (US); Jorge Campello de Souza, Cupertino, CA (US); Mario Blaum, San Jose, CA (US); Ivana Djurdjevic, San Jose, CA (US); Jihoon Park, San Jose, CA (US)

(73) Assignee: HGST Netherlands, B.V., Amsterdam (NL)

( * ) Notice: Subject to any disclaimer, the term of this patent is extended or adjusted under 35 U.S.C. 154(b) by 985 days.

(21) Appl. No.: 12/196,758

(22) Filed: Aug. 22, 2008

(65) Prior Publication Data

US 2010/0050053 A1 Feb. 25, 2010

(51) Int. Cl.
*G11C 16/04* (2006.01)

(52) U.S. Cl. .......... 365/185.11; 365/185.09; 365/185.33

(58) Field of Classification Search ............. 365/185.11, 365/185.09, 185.33
See application file for complete search history.

(56) References Cited

U.S. PATENT DOCUMENTS

| | | | |
|---|---|---|---|
| 5,459,850 A | 10/1995 | Clay et al. | |
| 5,692,138 A | 11/1997 | Fandrich et al. | |
| 5,754,567 A | 5/1998 | Norman | |
| 5,877,986 A | 3/1999 | Harari et al. | |
| 5,905,858 A | 5/1999 | Jeddeloh | |
| 5,956,743 A | 9/1999 | Bruce et al. | |
| 6,069,827 A | 5/2000 | Sinclair | |
| 6,279,072 B1 | 8/2001 | Williams et al. | |
| 6,360,346 B1 | 3/2002 | Miyauchi et al. | |
| 6,584,015 B2 | 6/2003 | Katayama et al. | |
| 6,751,766 B2 | 6/2004 | Guterman et al. | |
| 6,850,443 B2 | 2/2005 | Lofgren et al. | |
| 6,941,505 B2 | 9/2005 | Yada et al. | |
| 7,012,835 B2 * | 3/2006 | Gonzalez et al. | 365/185.11 |
| 7,082,066 B2 | 7/2006 | Yamada | |
| 7,210,077 B2 | 4/2007 | Brandenberger et al. | |
| 7,266,017 B2 * | 9/2007 | Harari et al. | 365/185.22 |
| 2003/0090941 A1 * | 5/2003 | Harari et al. | 365/185.29 |
| 2004/0083333 A1 | 4/2004 | Chang et al. | |
| 2007/0124533 A1 | 5/2007 | Estakhri et al. | |
| 2007/0226592 A1 | 9/2007 | Radke | |
| 2007/0263444 A1 | 11/2007 | Gorobets et al. | |
| 2008/0052599 A1 | 2/2008 | Aasheim et al. | |

FOREIGN PATENT DOCUMENTS

| | | |
|---|---|---|
| JP | 20001202793 | 7/2001 |
| JP | 2007207376 | 8/2007 |

OTHER PUBLICATIONS

Micheloni et al., "A 4Gb 2b/cell NAND Flash Memory with Embedded 5b BCH ECC for 36MB/s System Read Throughput," 2006 IEEE International Solid State Circuit Conference.

* cited by examiner

*Primary Examiner* — Huan Hoang
(74) *Attorney, Agent, or Firm* — Duft Bornsen & Fishman, LLP

(57) ABSTRACT

Flash memory devices and associated methods are described for controlling data errors in the devices through various forms of decoding, error correction, and wear concentration. To this end, a flash memory device may be partitioned into a plurality of sectors. Data may then be received from, for example, a host processor for storage within the flash memory device. Storage durations of the data are then estimated and the data is stored in the data sectors based on those estimated storage durations.

22 Claims, 6 Drawing Sheets

ERROR CONTROL IN A FLASH MEMORY DEVICE

BACKGROUND OF THE INVENTION

1. Field of the Invention

The invention is related to the field of flash memory devices. More particularly, the invention relates to controlling data errors in the devices through various forms of decoding, error correction, and "wear concentration".

2. Statement of the Problem

Flash memory is non volatile computer memory that can be electrically erased and reprogrammed and does not require power to maintain stored information. Additionally, flash memory offers relatively fast read access times and generally better kinetic shock resistance than hard disks. Another feature of flash memory is its durability, being able to withstand intense pressure, extreme temperatures, and even immersion in water. Such features are clearly advantageous to portable devices, such as cell phones, portable digital assistants (PDAs), and media players, such as the Apple, Inc. iPod.

Flash memory devices typically contain user data areas and overhead data areas. Such overhead information typically includes erase block management data and/or sector status information. Erase block management of a flash memory device generally provides logical sector to physical sector mapping.

Flash memory devices experience a greater incidence of errors than other forms of media due to increased memory cell densities, manufacturing inconsistencies, lower operating voltages, and, more particularly, excessive use of the devices. For instance, flash memory devices experience write fatigue over time which leads to less data integrity.

In some instances, flash memory devices are abstracted by various software drivers, management routines, and hardware support circuitry to hide defective regions from host systems to counter the errors. This abstraction of the memory device or computer usable storage is generally accomplished through the marking of bad memory blocks and their subsequent replacement with spare memory blocks. Additionally, error correction codes (ECCs) may be used to detect and correct data errors in retrieved data. ECCs may include block codes that are associated with a block of stored data or a data sector and stream codes that are typically utilized with streams of transmitted data. Error correction of data is generally done by a microprocessor or specialized hardware configured as an external microprocessor, a memory controller or within the memory device itself. Error correction is relatively complex and fairly processor intensive.

ECCs, and block codes in particular, are commonly based on specialized polynomial equations. Examples of such ECCs include Hamming codes, Reed-Solomon codes, Bose-Chaudhuri-Hochquenghem (BCH) codes, and cyclic redundancy check (CRC) codes. When the data is read out of a memory, the data integrity is checked by regenerating the coefficients embedded with the read data. The read data is passed through an ECC generator/checker to regenerate the ECC for comparison to the coefficients of the stored ECC. If the generated and stored ECCs do not match, an error has been detected. Once an error in the read data is detected, the transfer of the data out of the memory device is halted and the ECC correction algorithm initiates to correct the data error. However, an overhead cost is associated with the ECC. These overhead costs come in the form of increased storage space required for storing the ECC codes to allow detection and correction of errors in the stored data. In other words, ECCs generally require the association of extra bits to data and thus take away from the space available for data storage in a memory device.

Generally, the number of bits of an ECC determines the number of errors that can be detected and/or corrected. For instance, 1-bit ECC algorithms enable a set of symbols to be represented such that if one bit of the representation is incorrect, or "flipped", the symbols will be corrected. 2-bit ECC algorithms enable a set of symbols to be represented such that if two bits of the representation are flipped or otherwise incorrect, the two bits will be corrected. Often, the use of a 2-bit ECC algorithm is preferred to a 1-bit ECC algorithm due to the ability of a 2-bit ECC algorithm to detect and correct more bits. However, the implementation of a 2-bit ECC algorithm, while providing increased error correction capabilities of stored data, generally involves more calculations and overhead than the implementation of a 1-bit ECC algorithm. When more computational overhead is required, more power is consumed by the flash memory device. As a result, the overall performance of a memory system may be compromised.

To reduce the computational and power requirements associated with implementing a 2-bit ECC algorithm, some systems may use 1-bit ECC algorithms to encode and to decode data, even though such algorithms are less accurate. In many cases, when a block is fairly new and has not been subjected to a relatively high number of erase/write cycles, a 1-bit ECC algorithm may be sufficient to ensure the integrity of much of the data. However, as a block gets older and subjected to a relatively high number of the erase/write cycles, a 1-bit ECC algorithm may not be sufficient to ensure a desired level of data integrity.

A hybrid ECC implementation enables a 1-bit ECC encoding and decoding of data in blocks which have undergone a relatively low number of erase/write cycles. For blocks which have undergone a relatively high number of erase/write cycles, a 2-bit ECC encoding and decoding of data is used. By dynamically determining when data is to be encoded using a more accurate algorithm, storage capacity decreases over time as opposed to an initial decrease of storage capacity through the use of a long term ECC algorithm. Moreover, the power requirements of the flash memory device increase over time via the dynamic allocation of ECC rather than the immediate power consumption associated with a larger ECC.

To implement the hybrid ECC algorithm, the flash memory device uses a threshold count of a number of erase/write cycles as an indicator of when to use a less calculation-intensive/lower accuracy ECC algorithm or a more calculation-intensive/higher accuracy ECC algorithm to encode data. For instance, when a comparison of the number of erase/write cycles undergone by a block breaches a threshold number of 100,000 erase/write cycles, then a higher accuracy ECC algorithm is used. In any case, the dynamic allocation of ECC still requires that space be allocated from the flash memory device thus reducing the overall capacity of the device.

Another manner of extending the usable life of the flash memory device regards the implementation of "wear leveling". Wear leveling attempts to arrange data so that erasures and re-writes are distributed evenly across the flash memory cells of the flash device. In this way, no single sector prematurely fails due to a high concentration of erase/write cycles. A problem, however, exists with wear leveling as it still results in a substantial decrease in storage capacity over the useful life of the device by quickly decreasing the storage capacity of individual cells.

SUMMARY OF THE INVENTION

Embodiments of the invention operate to control errors within a flash memory device. In this regard, various systems and methods described herein provide for "wear concentration" and decoding of data within the flash memory device. The wear concentration aspect of the invention partitions the flash memory device into a plurality of data sectors. Data is then stored in these sectors based on their write frequencies and/or their storage durations. Data with shorter storage durations is stored in predetermined partitions such that those flash memory cells wears away faster. However, the average storage capacity of the flash memory cells is greater over time when compared to wear leveling. The decoding aspect of the invention selects candidate data sequences to represent data read from the flash memory cells of the device with errors.

In one embodiment of the invention, a method of using a flash memory device includes partitioning the flash memory device into at least first and second sectors. The first sector is adapted to store data having a first range of storage durations and the second sector is adapted to store data having a second range of storage durations that is different than the first range of storage durations. The method also includes receiving first data to be written to the flash memory device. The method also includes estimating a storage duration for the first data and storing the first data in the first sector based on the estimated storage duration of the first data.

In another embodiment, a flash memory system includes an array of flash memory cells and a partitioner adapted to partition the flash memory device into at least first and second sectors. The first sector is adapted to store data having a first range of storage durations and the second sector is adapted to store data having a second range of storage durations that is different than the first range of storage durations. The flash memory system also includes a data analyzer communicatively coupled to the partitioner and adapted to receive first data for storage in the flash memory cells, estimate a storage duration for the first data, and store the first data in the first sector based on the estimated storage duration of the first data.

The invention may include other exemplary embodiments described below.

DESCRIPTION OF THE DRAWINGS

The same reference number represents the same element or same type of element on all drawings.

DETAILED DESCRIPTION OF THE INVENTION

FIGS. 1-6 and the following description depict specific exemplary embodiments of the invention to teach those skilled in the art how to make and use the invention. For the purpose of teaching inventive principles, some conventional aspects of the invention have been simplified or omitted. Those skilled in the art will appreciate variations from these embodiments that fall within the scope of the invention. Those skilled in the art will appreciate that the features described below can be combined in various ways to form multiple variations of the invention. As a result, the invention is not limited to the specific embodiments described below, but only by the claims and their equivalents.

Figure 1:
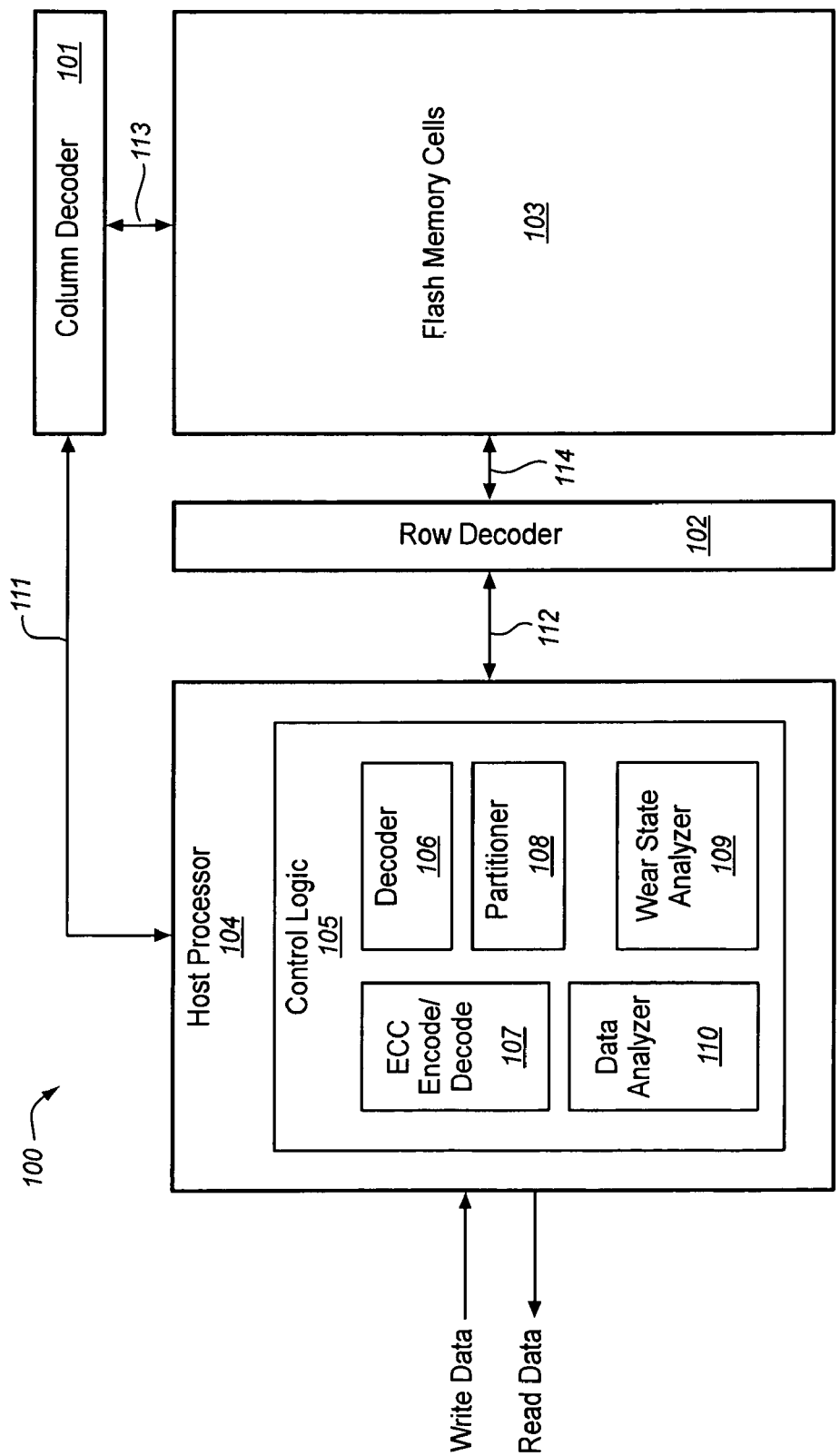
FIG. 1 is a block diagram of an exemplary flash memory device in an exemplary embodiment of the invention.

FIG. 1 shows a block diagram of flash memory device 100 including an array of flash memory cells 103. Flash memory device 100 also includes host processor 104 that provides for general control of flash memory device 100. Flash memory cells 103 are individually addressable and arranged in the array in rows and columns. In this regard, host processor 104 also includes control logic 105 that interfaces with the array of flash memory cells 103 via row decoder 102 and column decoder 101. Individual flash memory cells 103 are controlled by word lines 114 that extend along the rows of the array and bit lines 113 that extend along columns of the array. During a read access, a row address is latched and decoded by row decoder 102, which selects and activates a "row page" of memory cells 103 for transfer via interface 112. The column address of the read access is latched and decoded by column decoder 101. Column decoder 101 then selects the specified column data from flash memory cells 103 for transfer via interface 111. Similarly, during a write access, row decoder 102 selects a row page of flash memory cells 103 for writing whereas column decoder 101 selects a column address of flash memory cells 103 for writing.

In addition to general read and write operations to the array of flash memory cells 103, control logic 105 also performs certain functions that advantageously extend the "useful life" of flash memory cells 103. For instance, flash memory cells 103 may be subject to "wear" as the number of writes and erasures to the cells increase over time. This wear of flash memory cells 103 causes an increase in the number of errors in data being read from flash memory cells 103 over time. These errors can be corrected through the use of error correction codes and managed by wear leveling techniques, as mentioned above. At some point, however, these methods for extending the life of flash memory cells 103 become impractical due to power considerations, storage constraints, etc. In this regard, control logic 105 may extend the useful life of flash memory cells 103 via novel "wear concentration" and decoding processes.

To perform wear concentration, control logic 105 may include data analyzer 110 for analyzing write data to be written to flash memory cells 103. Data analyzer 110 estimates storage durations of the data such that data with shorter storage durations may be concentrated into certain designated areas of the array of flash memory cells 103. Data with longer storage durations may be stored elsewhere in the array to maintain its data integrity. To assist in this manner, control logic 105 may also include partitioner 108 that partitions flash memory cells 103 into sectors based on estimated data storage durations. For instance, each partitioned sector of flash memory cells 103 may have an associated range of storage durations such that data with one range of storage durations is stored in one partition, data with a second range of storage durations is stored in a second partition, and so on. In this regard, data analyzer 110 may analyze write data as received by host processor 104 to estimate its storage duration within flash memory cells 103 and store the write data accordingly. Similarly, data analyzer 110 may be configured to estimate write frequencies of data. For example, data with greater write frequencies may be concentrated into certain designated areas of the array of flash memory cells 103 while data with lower write frequencies may be stored elsewhere in the array to maintain its data integrity. Thus, storage duration and write frequency estimates for wear concentration purposes may be used.

Control logic 105 may also include wear analyzer 109 to evaluate the wear or data integrity of flash memory cells 103. For instance, wear analyzer 109 may determine the number of times that write data has been written to flash memory cells 103. Wear analyzer 109 may do so by evaluating the number of writes on a sector by sector basis as well as a cell by cell basis of flash memory cells 103. Wear analyzer 109 may also evaluate a number of the erase/write cycles to flash memory cells 103. Wear analyzer 109 may generate information that is used by data analyzer 110 in estimating storage durations of received data. For instance, data analyzer 110 may use the information from wear analyzer 109 to improve storage duration estimates of data being written to flash memory cells 103.

Control logic 105 may also include decoder 106 that corrects read data errors from flash memory cells 103. Typical decoders use ECCs such as those described above to correct errors in read data. Decoder 106 differs from these typical ECC decoders by empirically correcting errors. For instance, decoder 106 may receive information from wear analyzer 109 pertaining to wear or data integrity of the various sectors of flash memory cells 103. When data is read from flash memory cells 103, decoder 106 may evaluate the read data to select one or more likely candidates, based on the data integrity of the sector from which the data was read, to represent the read data. In other words, decoder 106 may determine that certain read data has probable errors based on the number of times data has been written to the sector of flash memory cells 103 used to store the read data.

Those skilled in the art should readily recognize that control logic 105, and for that matter its components, may be implemented in hardware, software, firmware, or any combination thereof to provide the desired operation. Accordingly, the invention is not intended to be limited to any particular implementation.

Figure 2:
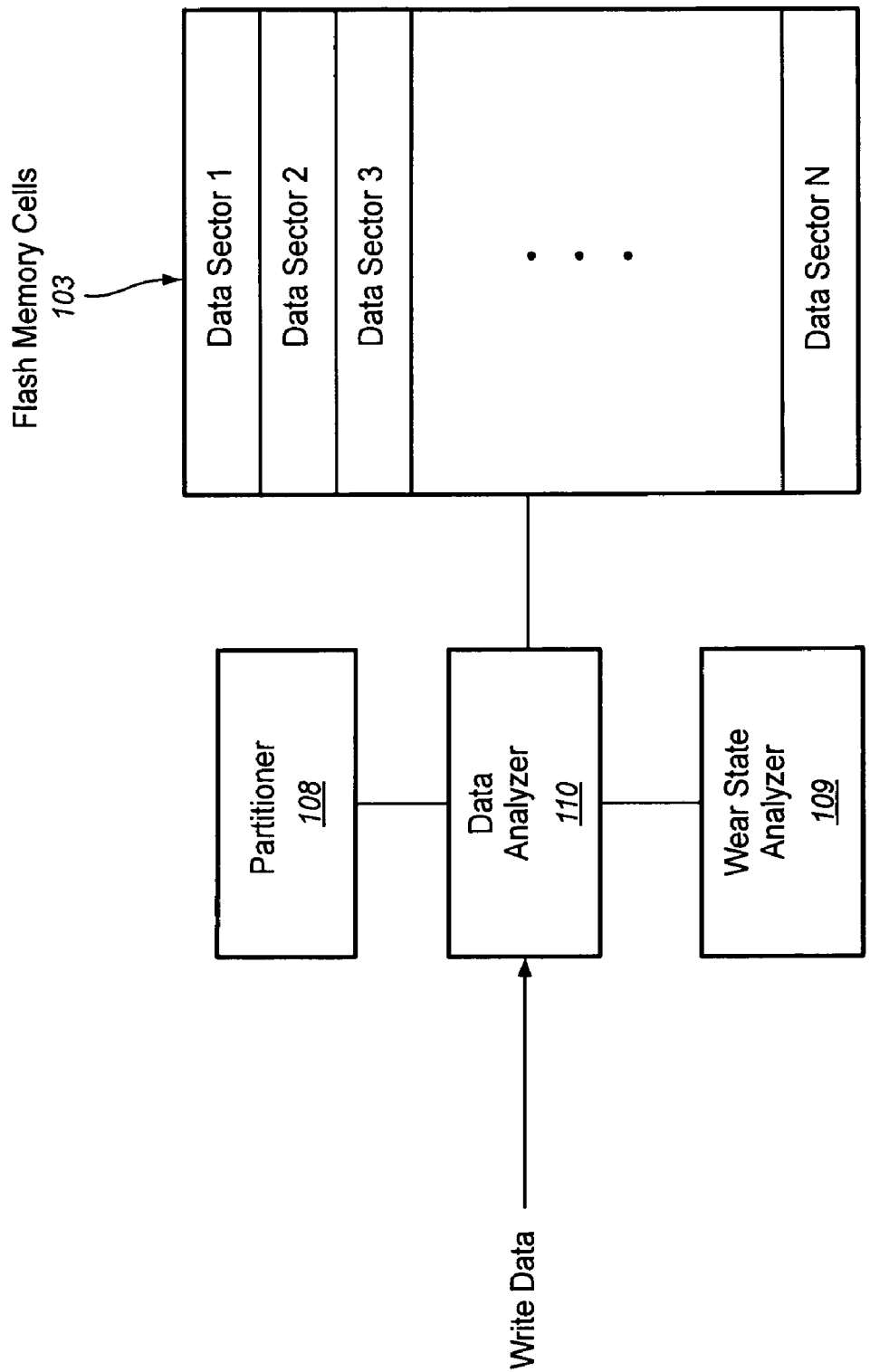
FIG. 2 is a block diagram illustrating partitioning of the flash memory device in an exemplary embodiment of the invention.

FIG. 2 is a block diagram illustrating partitioning of flash memory device 100 in an exemplary embodiment of the invention. In this embodiment, data analyzer 110 receives write data and analyzes the data to estimate its write frequency or storage duration. To illustrate such estimations, data analyzer 110 may evaluate the data being received according to its type. For instance, metadata is a type of data that generally changes more quickly than data files and is often used to facilitate the understanding, characteristics, and management usage of data files. Album names, song titles and album art that are embedded in music files are examples of metadata that are used to generate artist and song listings in a portable music player, such as an Apple Inc. iPod. Music files themselves on the other hand are generally considered to be data files. Other non limiting examples of metadata may include information such as a playlist and information pertaining to the number of times a particular music file has been played, the dates and times the music file was played, inode trees, and block bitmaps. Some of this metadata therefore may be written and even overwritten to flash memory cells 103 more often than the music files themselves. Accordingly, their storage durations are generally shorter than those of other types of data. Data analyzer 110 may detect such characteristics of write data and associate an estimate a storage duration with the write data. Data analyzer 110 may then store the write data according to the estimated storage duration or estimated write frequency of the data.

In another example, the data file of a cell phone may include information pertaining to a caller's identification, such as an associated username, a work phone number, cell phone number, fax number, speed dial reference, etc. Metadata may be exemplified in the received calls listing and/or dialed calls listing of a cell phone that registers, for example, the last ten phone calls of the listing. As phone calls from the received calls listing and/or dialed calls listing enter the listing, older registered calls are deleted. Data analyzer 110 may detect this frequently changing metadata and distinguish it from caller identification files stored long-term within the cell phone's flash memory. Data analyzer 110 may then associate a storage duration with this metadata and store it within a sector that has been designated by partitioner 108 with a range of storage durations that encompasses the associated stored duration of the metadata. In other words, data analyzer 110 may store data of a first estimated storage duration in a first sector having a first range of storage durations which the first storage duration falls within. Data analyzer 110 may then store data of second estimated storage duration in a second sector having a second range of storage durations (different than the first range of storage durations) which the second storage duration falls within.

Those skilled in the art should readily recognize that the invention is not intended to be limited to any particular storage duration. For example, one sector of flash memory cells 103 may be designated to store data that is merely milliseconds in storage duration, whereas a second sector of the flash memory cells 103 may be designated to store data that is on the order of minutes in storage duration, and a third sector may be designated to store data that is on the order of days in storage duration, etc. Nor should the invention be limited to any type of data. Rather, different devices may have different types of data as well as different durations for the different data types. For example, various data files and metadata of a cell phone may be largely different than the various data files and metadata of a media player and thus have different storage durations. The partition sectors of the flash memory may, therefore, have different storage duration ranges.

In one embodiment, partitioner 108 is communicatively coupled to data analyzer 110 to receive data characteristics of write data to adaptively partition flash memory cells 103 into a plurality of data sectors 1 . . . N, where N is merely intended as an integer greater than 1. For instance, partitioner 108 may initially designate data sector 1 as a storage location for data with a particularly short storage duration or a particularly high write frequency and then designate data sector 2 as a storage location for data with a greater storage duration or a lower write frequency, and so on. Such sector designations may be the result of empirical analysis associated with a particular apparatus and/or system in which flash memory device 100 is used. That is, partitioner 108 may initially designate sectors based on the write frequencies and/or storage durations of data being stored by a particular apparatus, such as a media player. Thereafter, data analyzer 110 may analyze the data being written by the apparatus to determine the write frequencies and/or storage durations of data to associate the data with an appropriate data sector.

In the alternative, partitioner 108 may simply define a certain number of sectors of flash memory cells 103. Data analyzer 110 may define the range of storage durations for each sector. Data analyzer 110 may then receive data, estimate its storage duration, and direct it to the appropriate sector.

Wear analyzer 109 may also be communicatively coupled to data analyzer 110 to determine the number of writes to each of the data sectors 1 . . . N. In this regard, wear analyzer 109 may ascertain a level of wear. Such information may be useful to partitioner 108 for subsequent partitions of write data. For instance, as a particular data sector wears away and errors become increasingly difficult to correct, partitioner 108 may repartition flash memory cells 103 into different data sectors, eventually even phasing out certain data sectors where data errors become too difficult to correct.

Although generally described with respect to portable media players and cell phones, the invention is not intended to be so limited. Rather, flash memory devices are employed in a variety of devices and systems. Other examples of devices that use flash memory include portable digital assistants (PDAs), flash drives, and computers. Thus, the systems and methods described herein may advantageously require use within any device that employs flash memory cells.

Figure 3:
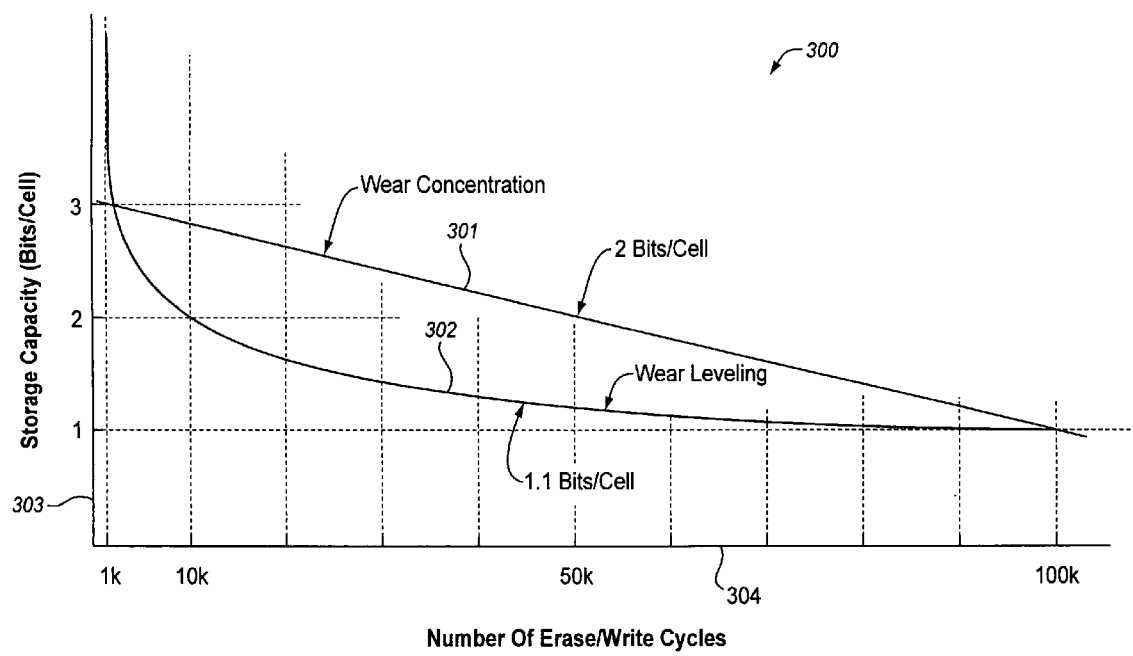
FIG. 3 is a graph illustrating storage capacity associated with wear concentration in an exemplary embodiment of the invention.

FIG. 3 is a graph 300 illustrating storage capacity associated with wear concentration in an exemplary embodiment of the invention. Wear leveling, as mentioned, is a technique that attempts to prolong the useful life of memory by evenly distributing erasures and rewrites across the flash memory cells such that sectors do not prematurely fail due to a high concentration of erase/write cycles. Wear concentration of the present invention, on the other hand, tends to focus or concentrate erasures and rewrites of data into certain sectors. Graph 300 illustrates the differences between wear leveling (indicated by data line 302) and wear concentration (indicated by data line 301). Graph 300 is organized according to storage capacity on axis 303 represented by the number of bits that a flash memory cell may contain. Axis 304 represents the number of erase/write cycles to the flash memory cell.

Initially, a flash memory cell may have an exemplary storage capacity of three bits when there are less than 1000 erase/write cycles to the flash memory cell. For instance, modern flash memory cells are capable of storing multiple bits per cell based on different voltage levels that may be maintained at the floating gate of the flash memory cell. After a flash memory device is manufactured, a flash memory cell may retain that storage capacity for roughly the first 1000 erase/write cycles. Thereafter, the storage capacity of the flash memory cell deteriorates with the number of erase/write cycles. Graph 300 shows this deterioration in storage capacity per memory cell which occurs in both wear leveling and wear concentration. However, wear concentration provides a more linear deterioration than wear leveling. Accordingly, wear concentration may result in an average of two bits of storage capacity per flash memory cell up to the first 50,000 erase/write cycles whereas wear leveling results in an average of roughly 1.1 bits of storage capacity per flash memory cell. While the two forms of wear of a flash memory device may eventually result in the same storage capacity over time, such as 100,000 erase/write cycles, the wear concentration manages to maintain a greater overall storage capacity for the flash memory device.

Although shown and described with specific numbers of storage capacity and erase/write cycles, those skilled in the art should readily recognize that the invention is not intended to be so limited. As manufacturing processes improve, flash memory cells may be configured to store more bits of information per cell. Moreover, improved manufacturing processes may result in better storage capacity and data integrity of flash memory devices. Accordingly, wear concentration as described herein may result in even better storage capacity over the number of erase/write cycles when compared to wear leveling.

Figure 4:
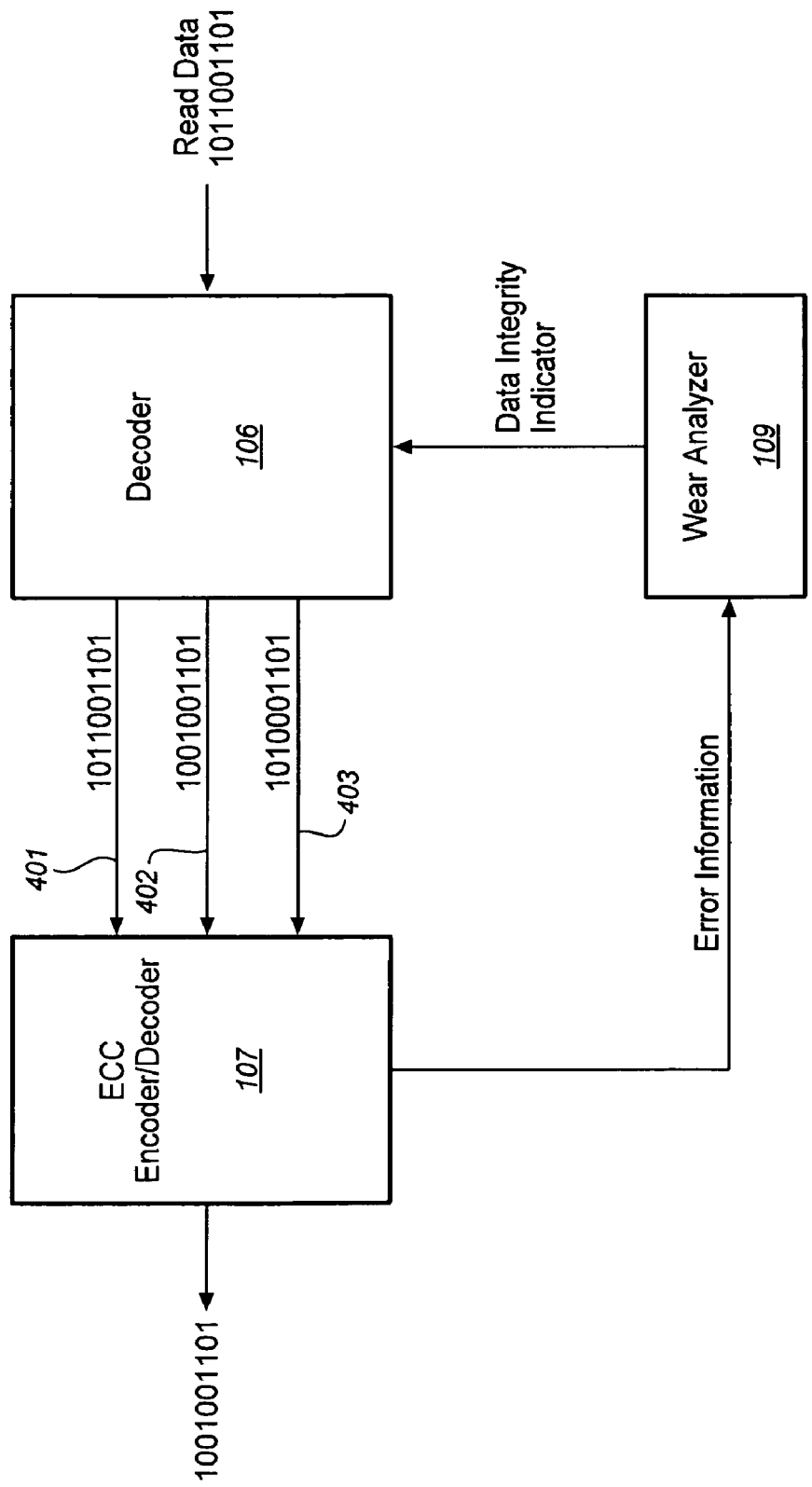
FIG. 4 is a block diagram of an exemplary decoder for a flash memory device in an exemplary embodiment of the invention.

FIG. 4 is a block diagram of exemplary decoder 106 for flash memory device 100 in an exemplary embodiment of the invention. Decoder 106 may be used to receive read data from the array of flash memory cells 103 and correct errors within that read data based on empirical analysis of flash memory cells 103. For instance, decoder 106 may be communicatively coupled to wear analyzer 109 to receive a data integrity indicator pertaining to flash memory cells 103 from which data is being read. This data integrity indicator generally regards the number of erase/write cycles performed on the flash memory cells 103 and the ability to return error free data. Based on empirical study of flash memory cells 103, certain errors may be predictable over various numbers of erase/write cycles to the memory cells 103. Decoder 106 may use this information to select likely candidates to represent the read data from flash memory cells 103. In other words, decoder 106 may use wear indications of flash memory cells 103 from which data is being read to determine likely errors in the read data and select a data sequence to correctly represent the read data. To illustrate, decoder 106 in this embodiment receives the read data sequence 1011001101 from a certain location in flash memory cells 103. Wear analyzer 109 may provide information pertaining to the wear of those flash memory cells in the form of a data integrity indicator to decoder 106. Decoder 106 may determine that the read data sequence 1011001101 may have zero or more errors. In this regard, decoder 106 may select likely candidates as follows: 1. Data sequence 401 which represents the read data with no errors; 2. Data sequence 402 which represents the read data with a single error in the third bit position of the read data when read from left to right as 1001001101; and 3. Data sequence 403 which represents the read data with a single error in the fourth bit position of the read data when read from left to right as 1010001101.

This "best guess" of data representation for the read data may substantially reduce the burden placed on subsequent ECC encoding. For instance, as flash memory cells 103 wear away and their read errors correspondingly increase, various levels of ECC may be applied to data being written to flash memory cells 103, as described above. As mentioned, a 1-bit ECC algorithm may correct a single error and identify two errors, while a 2-bit ECC algorithm may correct two bits in error and identify even more. In this regard, flash memory device 100 may also include ECC encoder/decoder 107 to employ such error correction. Thus, if decoder 106 is able to identify data sequences with fewer potential errors, a lower-level ECC algorithm may be used by ECC encoder/decoder 107 to correct those errors. Moreover, the ECC algorithm can be selected based on a number of probable errors detected by decoder 106. That is, if decoder 106 begins determining that there are two possible bit errors in a read data sequence, ECC encoder/decoder 107 may choose a 2-bit ECC algorithm for subsequent writes as opposed to automatically employing a 3-bit or higher ECC algorithm to correct the errors.

Since ECC encoder/decoder 107 may be used to detect and correct errors in read data, ECC encoder/decoder 107 may also be configured to track the number of errors in the read data from various sectors of flash memory cells 103. For instance, as wear analyzer 109 may be aware of locations in which read data is originating, ECC encoder/decoder 107 may generate error information when this data is being read such that wear analyzer 109 may associate error rates with those locations. In this regard, the control loop of ECC encoder/decoder 107 and wear analyzer 109 may adaptively control the errors associated with read data as wear of flash memory cells 103 increases.

Figure 5:
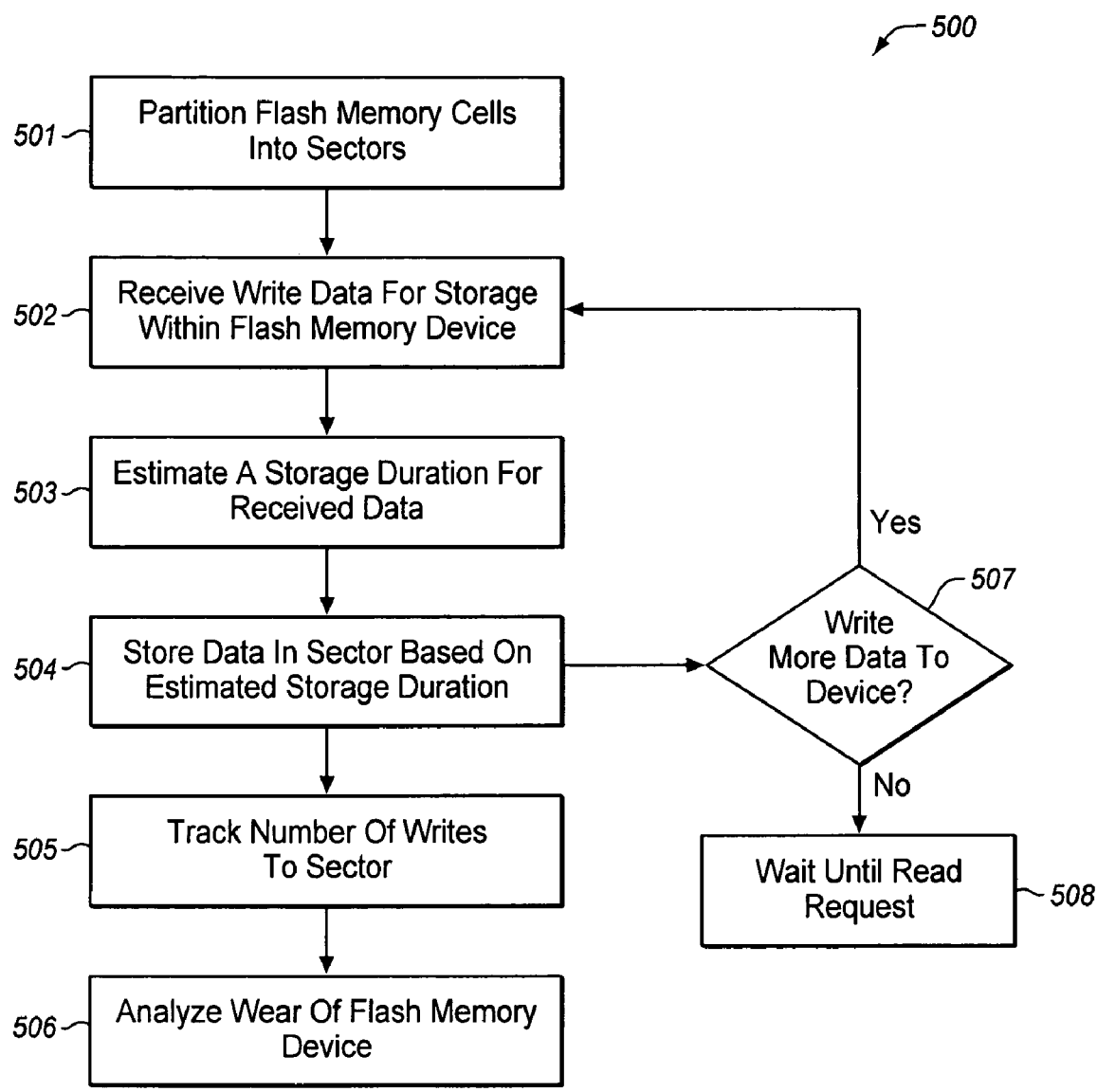
FIG. 5 is a flowchart illustrating a method of writing to a flash memory device in an exemplary embodiment of the invention.

FIG. 5 is a flowchart illustrating method 500 of writing to flash memory device 100 in an exemplary embodiment of the invention. Method 500 initiates, in step 501, with the partitioning of flash memory cells 103 into sectors. Memory cells 103 may be partitioned into sectors according to write frequency of data being written thereto. For instance, an initial determination may be made regarding various storage durations of data within flash memory cells 103. Partitioner 108 may then partition flash memory cells 103 into sectors based on those initial storage durations. To illustrate, data having a storage duration of a few seconds may be designated for a first data sector within flash memory cells 103 whereas data having a storage duration on the order of hours may be designated for a second data sector within flash memory cells 103. These storage durations are, of course, merely exemplary and may be adjusted according to need. With memory cells 103 partitioned into sectors, write data may be received from a host processor, in step 502.

In step 503, a storage duration is estimated for the write data that is received. The write data is then stored in an appropriate sector of flash memory cells 103 based on the estimated storage duration, in step 504. In step 507, a decision is then made as to whether more data is to be written to flash memory device 100. If more data is to be stored within flash memory device 100, the method 500 returns to step 502 to receive additional write data. If no other data is to be written to flash memory device 100, the method proceeds to step 508 where the method waits for a read request, as described in FIG. 6.

Additionally, in step 505, wear analyzer 109 may track the number of data writes to the partitioned sectors of flash memory device 100. In this regard, wear analyzer 109 may also keep track of writes to individual flash memory cells 103. For instance, the number of writes to flash memory cells 103 may be used to analyze the wear or data integrity of flash memory cells 103, in step 506, as described above. This data integrity indication may be used in subsequent ECC encoding of write data and/or partitioning of flash memory cells 103.

Figure 6:
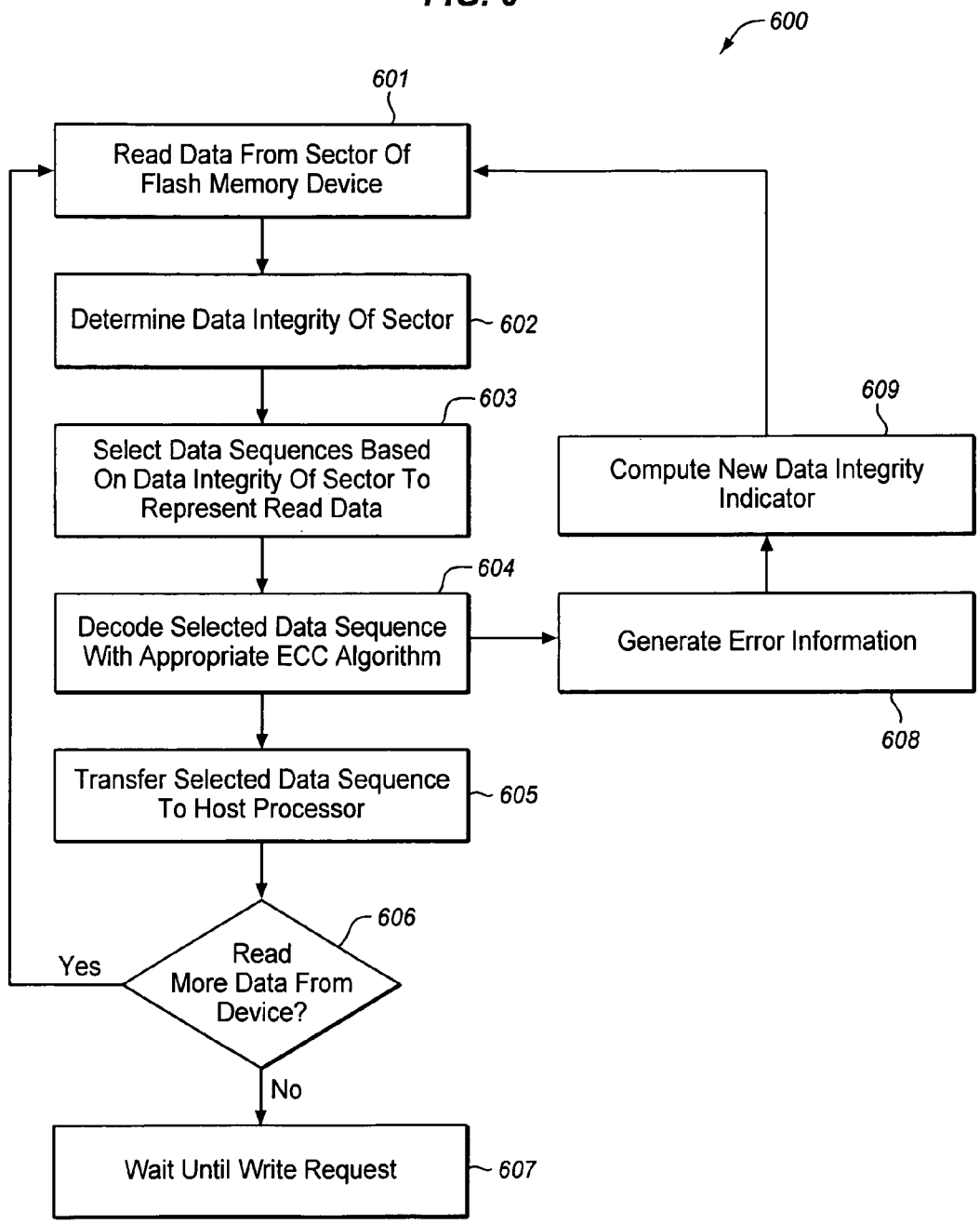
FIG. 6 is a flowchart illustrating a method of reading from a flash memory device in an exemplary embodiment of the invention.

FIG. 6 is a flowchart illustrating a method 600 of reading from flash memory device 100 in an exemplary embodiment of the invention. In step 601, control logic 105 directs row decoder 102 and column decoder 101 to retrieve data from flash memory cells 103. In this regard, control logic 105 may transfer address information to row decoder 102 and column decoder 101 to read data from a particular sector of flash memory device 100. After the data is read from flash memory cells 103, wear analyzer 109 determines data integrity of the sector from which the data is read, in step 602. The data integrity indicator of the sector is then transferred to decoder 106 where, in step 603, decoder 106 uses the data integrity indicator to select one or more data sequences to represent the read data. For instance, the data from flash memory cells 103 may include errors as a result of excessive writes to flash memory cells 103. These errors may be empirically determined. That is, read data sequences may have certain expected errors based on the number of writes to flash memory cells 103 from which the read data originates. This empirical data may be used to select data sequences that are likely candidates of correct read data to represent the retrieved read data.

Once decoder 106 generates the representative data sequence(s) for the read data, the representative data sequence(s) may be transferred to ECC encoder/decoder 107 to correct any errors in the representative data sequence(s). Thus, in step 604, ECC encoder/decoder 107 may decode the representative data sequence with an ECC algorithm. For instance, ECC encoder/decoder 107 may select a 1-bit ECC algorithm to encode data when decoder 106 begins determining that representative data sequences have at least one error. In this regard, decoder 106, in transferring representative data sequences for retrieved read data, may also convey information pertaining to the number of expected errors within the representative data sequence(s), as illustrated by the representative data sequences 401-403 in FIG. 4. Thus, if decoder 106 transfers a representative data sequence having an expected two errors corrected, ECC encoder/decoder 107 may select a 2-bit ECC algorithm to encode subsequent write data. This selective application of ECC algorithms may advantageously reduce power consumption of flash memory device 100 and allocate additional storage space required by ECC algorithms over time.

In step 608, error information may be generated by ECC decoder 107 and transferred to wear analyzer 109. For instance, as decoder 106 begins determining the number of errors occurring within read data, ECC decoder 107 may transfer such information to wear analyzer 109 such that a data integrity indicator may be generated and used by decoder 106 in the selection of data sequences. In this regard, wear analyzer 109 may compute a new data integrity indicator that incorporates error information write frequency of certain data, and/or the number of writes to flash memory cells 103, in step 609. The new data integrity indicator may then be transferred to decoder 106 for use in the subsequent read of a particular sector.

In step 605, the selected data sequence may be transferred to a host processor thereby completing the read request. In step 606, a determination is made as to whether more data is to be read from flash memory device 100. If more data is to be read from flash memory device 100, method 600 returns to steps 601. If, however, no other data is to be read, method 600 traverses to step 607 to wait until a write request is made, as described in method 500 of FIG. 5.

Although specific embodiments were described herein, the scope of the invention is not limited to those specific embodiments. The scope of the invention is defined by the following claims and any equivalents thereof.

We claim:

1. A method of using a flash memory device, the method comprising:
   partitioning the flash memory device into at least first and second sectors, wherein the first sector is adapted to store data having a first range of storage durations and the second sector is adapted to store data having a second range of storage durations that is different than the first range of storage durations;
   receiving first data to be written to the flash memory device;
   estimating a storage duration for the first data; and
   storing the first data in the first sector based on the estimated storage duration of the first data.

2. The method of claim 1, wherein estimating the storage duration for the first data comprises analyzing the first data to determine whether the first data is a data file or metadata.

3. The method of claim 1, further comprising analyzing wear of the flash memory device for use in partitioning the flash memory device by determining at least one of a number of write operations to the sectors and a number of errors occurring within the sectors.

4. The method of claim 1, further comprising:
   reading the first data from the first sector of the flash memory device; and
   decoding the first data with an error correction algorithm by evaluating data integrity of the first sector and selecting a data sequence, based on the data integrity of the first sector, to represent the first data read from the first sector.

5. The method of claim 4, further comprising decoding the data sequence using an error correction code and generating, with the error correction code, error information for use in determining a data integrity indicator of the first sector.

6. The method of claim 5, further comprising using the data integrity indicator of the first sector to repartition the flash memory device.

7. The method of claim 1, further comprising:
receiving second data for storage in the flash memory device;
estimating a storage duration for the second data; and
storing the second data in the second sector based on the estimated storage duration of the second data.

8. The method of claim 1, wherein estimating a storage duration for the first data comprises evaluating a write frequency of the first data.

9. A portable device that includes flash memory, the portable device comprising:
an array of flash memory cells; and
control logic communicatively coupled to the array of flash memory cells and adapted to control data storage within the flash memory cells, wherein the control logic is further adapted to estimate storage durations of data to be stored in the flash memory cells and partition the array of flash memory cells into at least first and second sectors, wherein the first sector is adapted to store data having a first range of storage durations and the second sector is adapted to store data having a second range of storage durations that is different than the first range of storage durations.

10. The portable device of claim 9, wherein the portable device is a cell phone, a personal digital assistant, a media player, a flash drive, or a combination thereof.

11. The portable device of claim 9, further comprising a wear analyzer adapted to determine at least one of a number of write operations to said at least first and second sectors of the flash memory cells and a number of errors associated with said at least first and second of the flash memory cells.

12. The portable device of claim 9, further comprising a first decoder adapted to decode data from the flash memory cells by selecting a data sequence, based on wear of the flash memory cells, to represent data being read from the flash memory cells.

13. The portable device of claim 12, further comprising a second decoder adapted to decode the data sequence using a second error correction algorithm and generate error information used in computing a data integrity indicator of the flash memory cells.

14. The portable device of claim 13, wherein the control logic is further adapted to repartition the array of flash memory cells based on the data integrity indicator of the flash memory cells.

15. A flash memory system, comprising:
an array of flash memory cells;
a partitioner adapted to partition the flash memory device into at least first and second sectors, wherein the first sector is adapted to store data having a first range of storage durations and the second sector is adapted to store data having a second range of storage durations that is different than the first range of storage durations; and
a data analyzer communicatively coupled to the partitioner and adapted to receive first data for storage in the flash memory cells, estimate a storage duration for the first data, and store the first data in the first sector based on the estimated storage duration of the first data.

16. The flash memory system of claim 15, wherein the data analyzer is further adapted to estimate the storage duration for the first data by determining whether the first data is a data file or metadata.

17. The flash memory system of claim 15, further comprising a wear analyzer communicatively coupled to the partitioner and adapted to analyze wear of the flash memory device by determining at least one of a number of write operations to the sectors and a number of errors occurring within said at least first and second sectors, wherein the wear analyzer is further adapted to generate a data integrity indicator based on the at least one of a number of write operations to the sectors and a number of errors occurring within said at least first and second sectors.

18. The flash memory system of claim 16, wherein the partitioner is further adapted to receive the data integrity indicator from the wear analyzer and repartition the flash memory device.

19. The flash memory system of claim 15, further comprising a first decoder adapted to read the first data from the first sector of the flash memory device and decode the first data by evaluating wear of the first sector and selecting a data sequence, based on the wear of the first sector, to represent the first data read from the first sector.

20. The flash memory system of claim 19, further comprising a second decoder that decodes the data sequence using an error correction code and generates, with the error correction code, error information for use in determining subsequent wear of the first sector.

21. The flash memory system of claim 15, wherein the data analyzer is further adapted to receive second data for storage in the flash memory device, estimate a storage duration for the second data, and store the second data in the second sector based on the estimated storage duration of the second data.

22. A method of using a flash memory device, the method comprising:
partitioning the flash memory device into a plurality of sectors, each having an associated range of storage durations;
receiving data to be written to the flash memory device;
estimating a storage duration for the data; and
storing the data in a first sector based on the estimated storage duration of the data.

* * * * *